Aug. 11, 1964 A. O. BABBE 3,143,787

PRINTED CIRCUIT BOARD AND METHOD OF MAKING THE SAME

Filed Oct. 3, 1960 2 Sheets-Sheet 1

INVENTOR.
ARNOLD O. BABBE

BY Paul A. Weilein
ATTORNEY

INVENTOR.
ARNOLD O. BABBE
BY Paul A. Weilein
ATTORNEY

United States Patent Office 3,143,787
Patented Aug. 11, 1964

3,143,787
PRINTED CIRCUIT BOARD AND METHOD OF MAKING THE SAME

Arnold O. Babbe, Rancho Santa Fe, Calif., assignor to Air Logistics Corporation, a corporation of California
Filed Oct. 3, 1960, Ser. No. 59,872
10 Claims. (Cl. 29—155.5)

The present invention relates to printed circuits, and more particularly to a printed circuit board of novel construction, and the method of manufacturing the board so as to avail of certain super characteristics of the board construction.

Heretofore, printed circuit boards have been produced by applying to a fabric or paper reinforced plastic laminate, a so-called printed circuit pattern. Such circuit patterns have been applied to the plastic laminate in various manners and with some problems and difficulties arising out of the method of manufacture insofar as the production of a reasonably effective and durable printed circuit board is concerned. For example, it has been the practice heretofore to provide a panel or board having bonded thereto across substantially an entire face, a sheet of copper or electro-conductive material which, as is well known in the art, is resist printed over a desired pattern area, and subsequently, the unprinted area is etched away to leave on the panel an electro-conductive circuit pattern. A serious problem attendant to this method of producing printed circuitry has resided in the contamination of the circuit pattern and board by etching solutions, resulting in an electrical leakage and possible damaging corrosive action between adjacent portions of the electro-conductive printed circuit. Moreover, the bond of the circuit pattern to the insulating base or board has not been altogether satisfactory.

Further difficulties have been encountered in the making of electrical connections of various components to the printed circuit pattern. In this regard, it has been the practice heretofore to insert eyelets in perforations extending through the printed circuit board and through selected portions of the circuit pattern which are deformed into engagement with or otherwise connected to the electro-conductive circuit material on the opposite faces of the board to effect a mechanical interlock and electrical connection. Such connections have not been altogether satisfactory, however, particularly when the printed circuit components have been employed in installations wherein they are subjected to severe vibration such as in air-borne installations.

In the manufacture of printed circuit boards wherein the circuit is plated through holes in the board to effect an electrical connection between patterns on opposite faces of the board, uniformity of through hole plating has been a problem.

Among the primary objectives of the present invention is the provision of a method of manufacturing printed electrical circuit boards as well as the provision of a printed circuit board having superior mechanical strength and resistance to vibration, while at the same time having superior insulation properties.

In accordance with this objective, the invention contemplates providing a printed circuit board with connector bushings or other circuit components such as diode clips and the like, which are physically molded in the plastic impregnated laminate and soldered into the printed circuit in such a manner as to effectively avoid defective circuits due to the intrusion of plastic material into the juncture of circuit components such as the bushings, diode clips or other circuit elements.

Yet another object is to provide a printed circuit board and method of manufacture of the same wherein the reinforced plastic laminate board is sealed at the margins of the openings through which the bushings or other components extend as well as about the outer edges or margins of the board itself, thus preventing the exposure of the fabric reinforcement at edge surfaces, whereas heretofore such exposed fabric reinforcements have been conducive of circuit leakage due to contamination or moisture absorption.

Another object is to provide a printed circuit board having a profile determined by the use of replaceable and variable contour forming elements employed during the manufacture of the printed circuit board.

Another object is to provide a method of manufacturing printed circuit boards wherein a selected circuit pattern may be provided on a board forming plate by masking selected surface areas of the plate in such a fashion that the plate may be reutilized without remasking for the purpose of making a plurality of printed circuit boards from a single masked plate.

A further object is to provide a printed circuit board wherein the circuit pattern is securely connected or affixed to the supporting base or plastic laminate by means of a mechanical interlock.

Other objects, advantages and features of the invention will hereinafter be described or will become apparent to those skilled in the art, as the description progresses, and the novel features of the invention will be defined in the appended claims.

Figure 1:
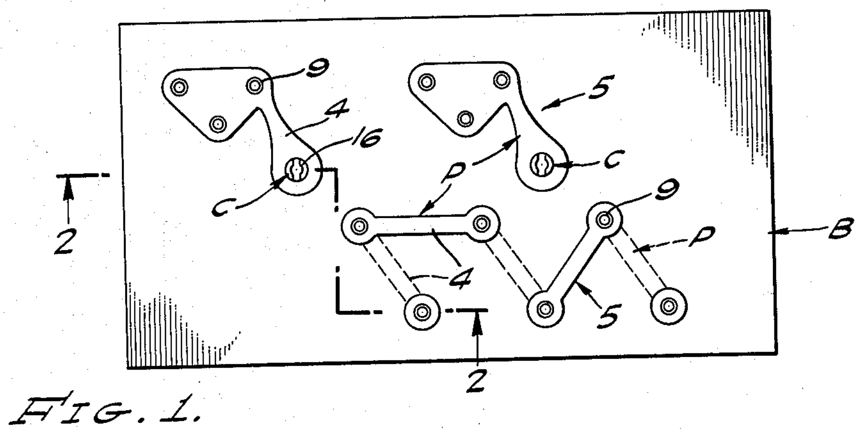
FIG. 1 is a plan view of a printed circuit board made in accordance with the invention.
Figure 2:
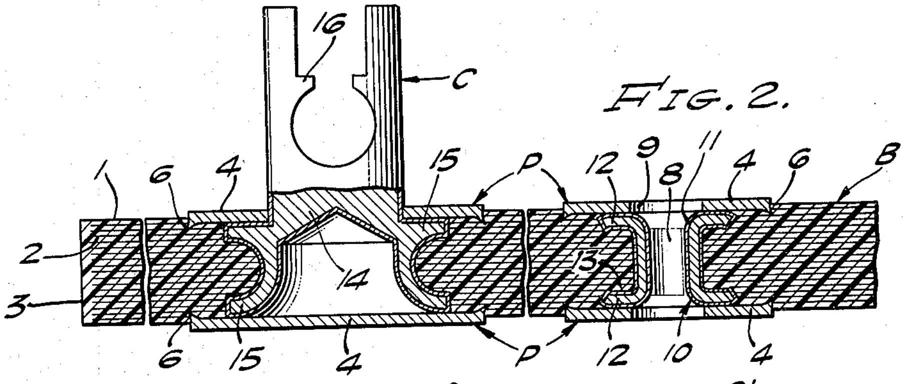
FIG. 2 is a cross sectional view as taken on the line 2—2 of FIG. 1.
Figure 4:
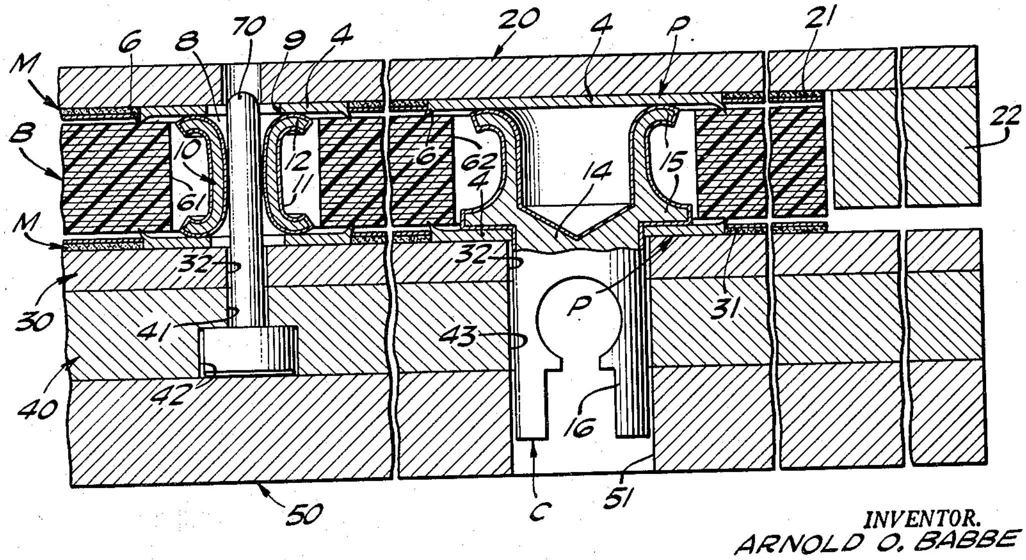
Figure 3:
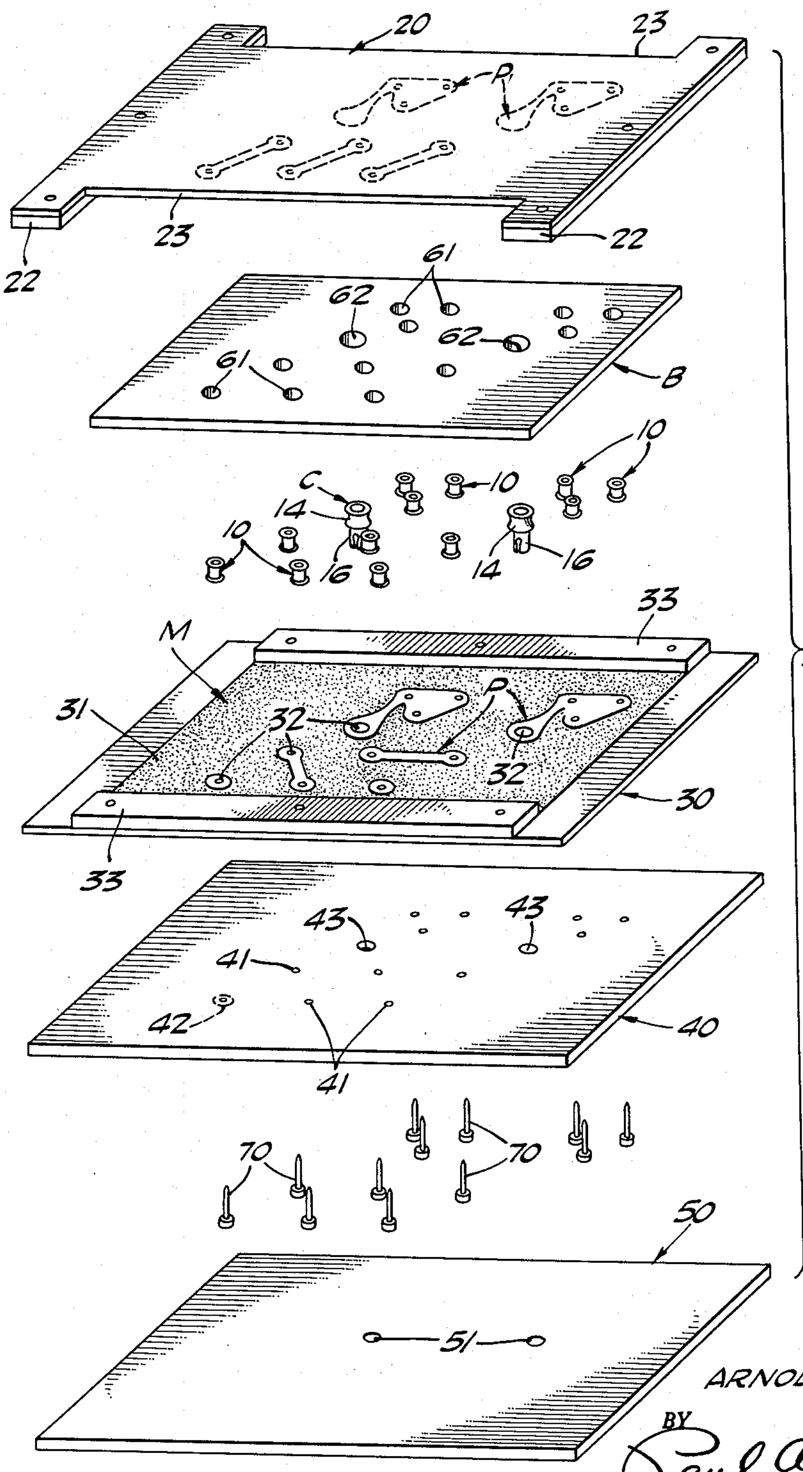

FIG. 3 is an exploded view in perspective illustrating the components useful in making the printed circuit board of FIGS. 1 and 2 in accordance with the method hereof; and FIG. 4 is a fragmentary view in section showing the cooperative relation of printed circuit board forming elements of FIG. 3 prior to the application of heat and pressure in the manufacture of a printed circuit board in accordance with the invention.

Like reference characters in the several views of the drawings and in the following description designate corresponding parts.

For illustrative purposes, there is shown in FIG. 1, a representative simple printed circuit board having printed circuit patterns on both of its sides. The printed circuit board comprises a plastic laminated or base board designated B, to be hereinafter more particularly described, on which has been disposed a printed circuit pattern P shown in full lines on one side of the board B and in broken lines on the other side of the board B. In addition, the board is shown as being provided at C with a diode clip which for the purposes of explanation will be characterized as a circuit element and which may in practice be a circuit element other than a diode clip, such as a connector or electronic components.

While the board B herein illustrated has been shown as rectangular in outline, it will be understood that the profile may be of any desired configuration, particularly in the light of the novel method of manufacturing the board, as will be hereinafter described.

While any suitable modable material may be employed, it will be noted, referring to FIG. 2, that the board B is typically composed of a plastic impregnated glass or other fabric laminate 1 wherein the fabric reinforcing lamina designated 2 terminate in spaced relation to the extreme peripheral edge of the board B, as indicated at 3, so that the periphery of the board is resin rich. The plastic material impregnating the fabric laminate is of the type which is adapted to be molded and cured under heat and pressure, for example, epoxy resin or other thermosetting resins or plastic materials which have been cured under heat and pressure to provide a rigid moisture impervious base for the printed circuit P.

The circuit P comprises a pattern of electroconductive strips 4 which may be interconnected and broken and formed in appropriate patterns, as may be desired for specific applications of the printed circuit board, or indeed, the circuit P may include circuit sections of any desired or appropriate geometrical outline as illustrated at 5. The electro-conductive printed circuit, in accordance with one of the features of the invention, is embedded in the plastic laminate and includes marginal projections 6 which extend into the plastic laminate 1 and project outwardly from the electro-conductive printed circuit so as to be so embedded in the plastic laminate as to perfect a mechanical interlock therewith, which securely holds the printed circuit P to the plastic laminate. In addition, the printed circuit P is preferably bonded to the plastic laminate as a result of being applied thereto under heat and pressure with or without the aid of an adhesive material.

The board B has apertures 8 therethrough aligned with apertures 9 in the printed circuit pattern. Electrical connection between the printed circuit patterns on the opposite faces of the board B is established in the instant invention by means of hollow bushings 10 which are disposed in the just-mentioned openings and may be composed of brass or other electro-conductive material. In accordance with the invention, the bushings 10 are tinned or precoated with a eutectic solder as indicated at 11.

The bushings 10 at their ends are provided with outwardly flared rims or end flanges 12 which extend between the printed circuit pattern P and the plastic laminate and are mechanically interlocked with the laminate as indicated by laminate sections 13 which are confined within the opposed end flanges of the bushings. The solder coating 11 on the bushing effects a mechanical and electrical connection between the printed circuit patterns on opposite faces of the plates in a manner which has not heretofore been attained. Furthermore, the solder lined bushing facilitates the soldering of circuit component connecting wires in the opening in the bushing by capillary soldering as is well known in assembling components to printed circuit boards.

The circuit components C, as best seen in FIG. 2, are preferably provided with a hollow base 14 having end flanges 15 substantially corresponding in form to the flanges 12 of the bushings 10 so as to be applied to the plastic laminate in substantially the same manner, as will be hereinafter described. In the illustrative embodiment hereof, the component C comprises a diode clip 16 supported on the base 14, although it will be understood that other components may be assembled to the board similarly or that securing studs or the like may be embedded in the board in the same manner as the component C.

Among the advantages attributable to the printed circuit construction thus far described, is superior resistance to vibration such as encountered in air-borne installations where previously available printed circuit boards have experienced considerable difficulties. In addition, the present printed circuit has superior electrical conductivity between the circuit patterns on opposite faces of the board by reason of the eutectic solder unity between the printed circuit and the conductive bushings 10. By reason of the projections or embedded edges 6 of the printed circuit P, the printed circuit has superior unity with the plastic laminate so as to admirably resist peeling from the plastic laminate.

The invention further contemplates, as pointed out at the commencement hereof, a novel method of manufacturing the printed circuit boards described above.

Referring to FIG. 3, apparatus in the form of laminating die mold components are illustrated which are particularly well suited to the performance of the method. These die parts include generally a top die plate 20, a bottom die plate 30, a pin holder plate 40 and a component cavity plate and die base 50. In the illustrative embodiment, the printed circuit pattern P is shown in broken lines on top die plate 20 and in full lines on bottom die plate 30. The definition of the printed circuit pattern is acquired by applying to the lower face of the top plate and the upper face of the bottom plate a mask M of suitable material such as cured resin or ceramic material in the event that stainless steel die plates are employed. It has been found that screen process printing of the mask with resin which is substantially cured, is quite satisfactory.

The circuit pattern P is preferably electrolytically plated on the unmasked areas of the die plates 20 and 30 in such a manner that an outgrowth is formed at the periphery of the printed circuit P, this outgrowth being designated 6 in the foregoing description of the article of manufacture.

The bottom die plate 30 is provided with apertures 32 for the reception of the diode clip or other circuit components C previously referred to above. Beneath the bottom die plate 30 is the pin holder plate 40 referred to above, having apertures 41 therein aligned with enlarged pin head receiving cavities 42, these apertures 41 and cavities 42 are disposed in predetermined relation relative to one another so as to be aligned with those portions of the printed circuit pattern P to be interconnected as hereinafter to be described.

Beneath the pin holder plate 40 is the base plate 50 referred to above, which is provided with cavities 51 for the reception of downwardly projecting portions of circuit components C such as the diode clip 16 as referred to in the foregoing. Likewise, the pin holder plate 40 is provided with apertures 43 for the passage of components C.

Between the top and bottom die plates 20 and 30, respectively, there is illustrated the board B which is cut to the desired initial size and initial shape and drilled as at 61 in a plurality of locations corresponding to the apertures 41 in the pin holder plate 40. The board B is also drilled as at 62 in positions so as to be alignable with the openings 32 in bottom die plate 30, 43 in pin holder plate 40, and 51 in base plate 50. This board B, as previously mentioned, is composed of plastic, preferably epoxy resin impregnated fabric such as fiberglass, and at this stage of its manufacture, would be uncured or only partially cured.

In order to define the peripheral configuration of the finished printed circuit board, the upper die plate 20 is provided with end dams 22 removably attached to the top die plate 20 at its under surface. In addition, the die plate 20 is provided with recesses or indentations 23 extending along its edges disposed normal to the end dams 22, and the bottom die plate 30 is provided along its corresponding edges with removable dams 33 corresponding in contour to the indentations or recesses 23 of top plate 20 so as to be received therein. It is believed apparent that the dams 22 and 33 may be any desired configuration for the purpose of defining the peripheral contour of the plate B.

An appropriate number of headed pins 70 are disposed in the recesses 42 and apertures 41 of the pin holder plate 40 so as to extend upwardly therethrough. It should be understood that the pins 70 in the practical usage of the present method remain in the pin holder plate 40, but may be removed for replacement of damaged pins. Circuit components C such as the diode clips are located in the cavities 51 of cavity or base plate 50 and extend upwardly through openings 43 in the pin holder plate.

Assuming the elements of FIG. 3 to be conditioned for the manufacture of a printed circuit board as shown in FIGS. 1 and 2 as by the application of the mask 21 and 31 on the top and bototm die plates 20 and 30, respectively, the masks may now be coated with a layer of silicone or other appropriate material which will not bond to the plastic board B responsive to heat and pressure, or alternatively, a mask material such as "Teflon," for example, or a silicone base material may be employed which does not require the application of a mold release material.

The bottom die plate may now be disposed upon the pin holder plate so that the pins 70 will project through apertures in the bottom die plate and through corresponding apertures in the circuit pattern plated thereon. The pins will extend above the printed pattern P on bottom die plate 30, and on the upwardly projecting pins, the previously solder plated bushing 10 as referred to above, are centralized. Thereafter, the uncured plastic laminate board B is placed upon the bottom die plate 30 so that the bushings 10 are disposed in the aperture 61 of the board, and the anchor portions 14 of the components C are disposed in the aperture 62 of the board, with the board disposed between the dams 33. Thereafter, the top die plate 20 is placed upon the uncured plasmic laminate board B with the printed circuit patern P of the former properly oriented relative to the printed circuit pattern P on the base plate 30.

Such assemblage of the laminating die mold parts with the printed circuit board elements, will result in the assembly as shown in FIG. 4. It will be noted in this FIG. 4 that the apertures 61 through the plastic laminate B in its uncured stage, are of such diameter as to freely receive the bushing 10, and the bushing 10 is centralized upon the pin 70 with the bushing's end flanges 12 projecting generally normal to the axis of the pin 70. In addition, the thickness of the plastic laminate B in its uncured state is greater than the thickness of the dams 33 and 22, therefore, upon the application of heat and pressure sufficient to enable flow of the plastic material of the uncured plastic laminate, the material will be displaced into the zone lying between the end flanges 12 of the bushing 10, as well as into engagement with the dams at the ends and sides of the laminating die mold assembly.

In addition, the fiberglass fabric itself will expand within its limits so as to be forced into the zone lying between the opposed end flanges 12 of the bushings 10. Nevertheless, the plastic impregnating material will flow to all of the peripheral regions in such a fashion that these peripheral regions will be plastic rich and all of the ends of the fiberglass strands making up the fabric will be effectively sealed. At the same time, responsive to heat and pressure, it will be observed that a soldered connection will be perfected between the end flanges 12 of the bushings 10 and the printed circuit pattern P, and the bushings 10, which have an initial axial dimension slightly greater than the thickness of the uncured plastic laminate, will be deformed so that the flanges 12 thereof will be curled toward one another as the bushings are fore-shortened under axial pressures. Due to initial engagement between the end flanges 12 of the bushings 10 and the printed circuit patterns, seepage of plastic material between the bushings and the circuit pattern during application of heat and pressure will be precluded.

The edges 6 of the printed circuit patterns P constituting an outgrowth from the plating of the printed circuit pattern on the base plates, as hereinabove described, will be embedded in the plastic laminate during its curing operation.

In applying heat and pressure by conventional means to the laminating die mold assembly of FIG. 4, pressure and temperature ranges are selected which are compatible with both the resin or plastic laminate employed and the solder employed for the purpose of effecting an electrical connection between the printed circuit pattern and the bushings, diode clips or other components to be included in the circuit board. In the practical application of the method to produce circuit boards, it has been determined through usage of the method that epoxy resin plastic laminates may be cured at pressures ranging between 300 p.s.i. and 1500 p.s.i. at a temperature on the order of 350° F. over a time interval of from 10 to 20 minutes. In the production of these crcuit boards, the eutectic solder was a 60–40 tin-lead solder. It will be understood that within the purview of the invention other resins or plastics may be employed in the laminate and other solders may be availed of, and the controlling factors as to temperature and pressure employed in the manufacture of circuit boards in accordance with the invention will be the particular requirements of the plastic laminate material and a solder having a characteristic such that it will preferably effect unity between the bushing and the circuit pattern within the range of temperatures at which the plastic laminate may be cured.

Following cooling of the die assembly, the latter may be disassembled and the cured plastic laminate board B with the printed circuit P thereon together with circuit elements or bushings 10 and components C soldered to the circuit and carried by the board may be removed from the assembly. The printed circuit pattern, as clearly illustrated in FIG. 2, will be embedded and mechanically interlocked in the plastic board or laminate and partially projecting above the plane of the finish surface of the board a distance equal to the thickness of the masks on the die plates.

While the specific details of the printed circuit board of the invention as well as the specific steps of the method of the invention have been herein illustrated and described, it will be recognized that variations, modifications and alterations may be resorted to both as to the details of the printed circuit board and the molding die components as well as in certain of the steps of the method without departing from the spirit of the invention as defined in the appended claims.

I claim:

1. The method of manufacturing printed electrical circuit boards comprising: disposing between a pair of plates an uncured plastic board; said board having perforations therein; at least one of said plates having thereon a removable pattern of electro-conductive material; disposing in said perforations circuit elements coated with solder; and applying heat and pressure to said board, said electro-conductive material and said circuit elements while between said plates to cure said board and effect soldered connections between said circuit elements and said electro-conductive material.

2. The method of claim 1 in which said application of said heat and pressure causes the plastic board material to flow into engagement with said circuit elements.

3. The method of claim 1 including the step of confining said flow of said plastic board material at the periphery of said board.

4. The method of claim 1 in which said application of said heat and pressure is applied through said plates.

5. The method of manufacturing printed electrical circuit boards comprising: disposing between a pair of plates an uncured plastic board; said board having perforations therein; at least one of said plates having thereon a removable pattern of electro-conductive material; disposing in said perforations circuit elements coated with solder; said plastic board being composed of a plastic which is curable under pressure at a temperature below the temperature at which said solder will flow freely but above the temperature at which said solder will form a soldered connection between said circuit elements and said electro-conductive material; applying heat to said board, said electro-conductive material and said circuit elements at a temperature greater than that required to effect said soldered connection but less than that required to cause free flow of said solder; and applying pressure to said board through said plates.

6. The method of manufacturing printed electrical circuit boards comprising: disposing between a pair of plates an uncured plastic board; said board having perforations therein; at least one of said plates having thereon a removable pattern of electro-conductive material; disposing in said perforations circuit elements coated with solder; said plastic board being composed of a plastic which is curable under pressure at a temperature below the temperature at which said solder will flow freely but above the temperature at which said solder will form a soldered connection between said circuit elements and said electro-conductive material; applying heat to said board, said electro-conductive material and said circuit elements at a temperature greater than that required to effect said soldered connection but less than that required to cause free flow of said solder; and applying pressure to said board through said plates sufficient to cause the flow of said plastic board material into engagement with said circuit elements.

7. The method of manufacturing printed electrical circuit boards comprising: disposing an uncured plastic board between a pair of plates at least one of which has a circuit pattern of electro-conductive material thereon; soldering a circuit element to said electro-conductive material while applying heat to said plates to cure said plastic board; and transferring said circuit pattern to said board.

8. The method of manufacturing printed electrical circuit boards comprising: applying a mask to a perforated plate surface in a pattern leaving unmasked plate surface areas representative of the printed circuit and with the perforations in the plate exposed in said unmasked areas; plating said unmasked area with electro-conductive material; placing an uncured plastic perforated board between said plate and a base plate with the perforations in said perforated plate and said board aligned; centralizing in the aligned perforations circuit elements having a coating of solder thereon; applying heat to said board between said plates to effect a soldered connection between said circuit elements and said electro-conductive material; applying pressure to said board between said plates while said board is heated to cause the plastic to flow into contact with said circuit elements and to embed said electro-conductive material in said board and to cure said plastic board; and removing said board from between said plates with the electro-conductive material embedded therein and soldered to said circuit elements.

9. The method of claim 8, wherein said mask is permanently applied to said plate.

10. The method of claim 8, including also providing a pattern of electro-conductive material on said base plate, and transferring said latter pattern to said board responsive to the application of heat and pressure, while soldering said latter pattern to said circuit elements.

References Cited in the file of this patent

UNITED STATES PATENTS

| | | |
|---|---|---|
| 2,447,541 | Sabee et al. | Aug. 24, 1948 |
| 2,535,674 | Franklin | Dec. 26, 1950 |
| 2,724,674 | Pritikin | Nov. 22, 1955 |
| 2,772,501 | Malcolm | Dec. 4, 1956 |
| 2,972,003 | Greenman et al. | Feb. 14, 1961 |

FOREIGN PATENTS

| | | |
|---|---|---|
| 649,254 | Great Britain | Jan. 24, 1951 |